US012769896B2

(12) United States Patent
Macias et al.

(10) Patent No.: US 12,769,896 B2
(45) Date of Patent: Oct. 20, 2026

(54) OCCUPANCY MAPPING BASED ON GEOMETRIC ENTITIES WITH HIERARCHICAL RELATIONSHIPS

(71) Applicant: Intel Corporation, Santa Clara, CA (US)

(72) Inventors: Leobardo Campos Macias, Guadalajara (MX); Rafael De La Guardia Gonzalez, Teuchitlan (MX); David Gonzalez Aguirre, Portland, OR (US); Javier Felip Leon, Hillsboro, OR (US); Julio Cesar Zamora Esquivel, West Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/303,782

(22) Filed: Apr. 20, 2023

(65) Prior Publication Data

US 2023/0259665 A1 Aug. 17, 2023

(51) Int. Cl.
*G06F 30/10* (2020.01)
*G06F 30/27* (2020.01)

(52) U.S. Cl.
CPC .............. *G06F 30/10* (2020.01); *G06F 30/27* (2020.01)

(58) Field of Classification Search
CPC ................................. G06F 30/10; G06F 30/27
USPC .............................................................. 703/1
See application file for complete search history.

(56) References Cited

U.S. PATENT DOCUMENTS 10,916,035 B1 * 2/2021 Kroeger ............... G05D 1/0212
2019/0026958 A1 * 1/2019 Gausebeck ............. G06T 7/579
2020/0201351 A1 * 6/2020 Armstrong-Crews ....................... B60W 10/04
2021/0125052 A1 * 4/2021 Tremblay ................. B25J 18/00
2021/0183093 A1 * 6/2021 Park ........................ G06T 7/579
2022/0153297 A1 * 5/2022 Chen ....................... G01S 17/34
2022/0371606 A1 * 11/2022 Vora .................. B60W 50/0098
2022/0383640 A1 * 12/2022 Vora ....................... G06V 10/40

OTHER PUBLICATIONS

Gargantini, Irene "Linear octtrees for fast processing of three-dimensional objects", Computer Graphics and Image Processing 20, 365-374 (1982).

(Continued)

*Primary Examiner* — Justin C Mikowski
(74) *Attorney, Agent, or Firm* — Akona IP PC

(57) ABSTRACT

A system can map occupancy of objects. The system may generate an occupancy representation of an object based on a point cloud of the object. The system may generate first geometric entities based on the point cloud. Each first geometric entity contains one or more points in the point cloud. The system may also generate one or more second geometric entities, each of which contains one or more first geometric entities. The occupancy representation of the object includes the one or more second geometric entities and the plurality of first geometric entities. The occupancy representation may have a hierarchical structure where the first geometric entities may be on a lower level than the one or more second geometric entities. The system can also detect collision of the object with another object by using the occupancy representation of the object and an occupancy representation of the other object.

14 Claims, 10 Drawing Sheets

(56) References Cited

OTHER PUBLICATIONS

Oleynikova, Helen et al "Safe local exploration for replanning in cluttered unknown environments for microaerial vehicles", IEEE Robotics and Automation Letters, vol. 3, No. 3, Jul. 2018, Downloaded on Apr. 13, 2023 at 16:40:13 UTC from IEEE Xpl, pp. 1474-1481.

Satorras, Victor Garcia et al "E(n) Equivariant Graph Neural Networks", Proceedings of the 38th International Conference on Machine Learning, PMLR 139, 2021, arXiv:2102.09844v3 [cs.LG] Feb. 16, 2022, 16 pages.

Usenko, Vladyslav et al "Real-time trajectory replanning for MAVs using Uniform B-splines and 3D circular buffer", 2017 IEEE/RSJ International Conference on Intelligent Robots and Systems (IROS), Sep. 24-28, 2017; Downloaded on Apr. 13, 2023 at 16:36:26 UTC from IEEE Xplore, pp. 215-222.

* cited by examiner

100

800

OCCUPANCY MAPPING BASED ON GEOMETRIC ENTITIES WITH HIERARCHICAL RELATIONSHIPS

TECHNICAL FIELD

This disclosure relates generally to occupancy mapping, and more specifically, occupancy mapping based on geometric entities with hierarchical relationships.

BACKGROUND

Occupancy mapping can generate a map of an environment by generating occupancy representations of occupied spaces in the environment. An occupancy representation is a representation of an occupied space, such as a space occupied an object. The object may be a person, robot, furniture, natural objects, and so on. The object may be movable or fixed. Occupancy mapping can address the problem of generating maps from noisy and uncertain sensor measurement data. Occupancy mapping can be used for collision checks between volumes suitable for motion planning, computing graphics, and human-robot collaboration.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

Figure

DETAILED DESCRIPTION

Overview

Figure 1:
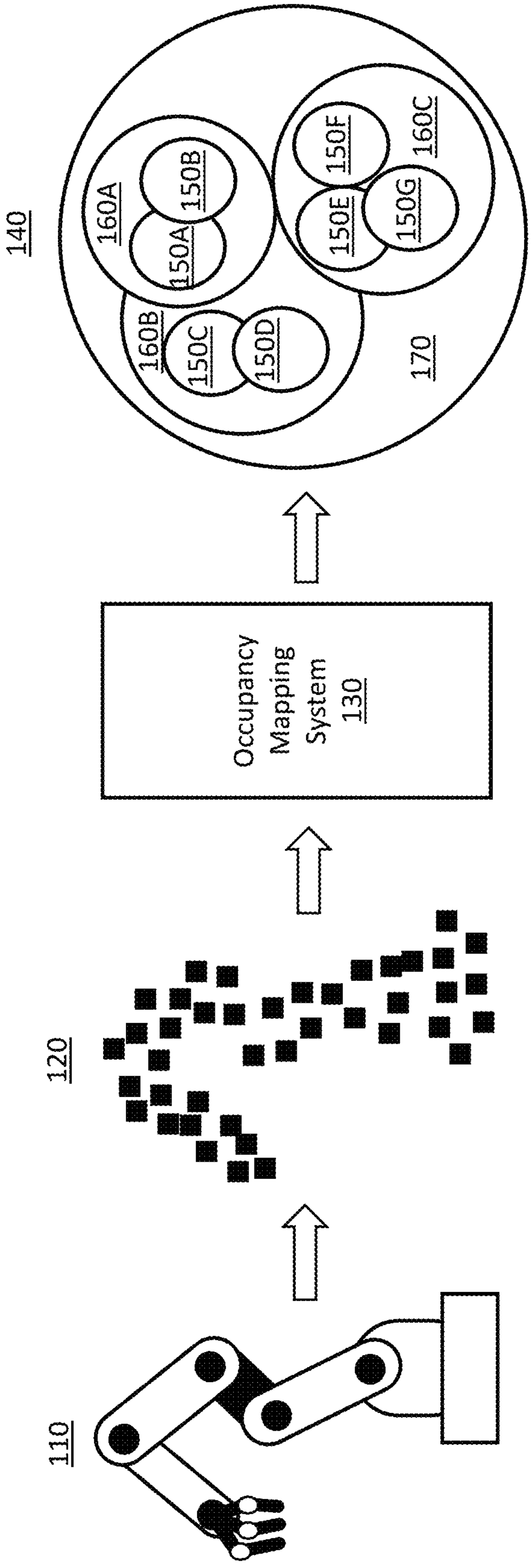
(FIG. 1 illustrates an example occupancy mapping environment, in accordance with various embodiments.

A currently available technology for occupancy mapping uses voxel grids to represent objects or environments. Voxel grids can be simple and effective in some applications, e.g., for fast look-up and insertion. However, voxel grids can grow logarithmically with the map size, which limits them to small spaces. Another currently available method for occupancy mapping uses spatial hash tables for sparse representation. Sparse representation can be dynamically expanded with constant time insertion and lookup. Yet currently available method for occupancy mapping uses octrees. An octree is a tree data structure n which each internal node has exactly eight children. An octree can provide a complete hierarchical data structure, but it suffers from the drawbacks of sacrificing raw speed in single queries. Linear octrees can trade-off reduced memory usage for speed by storing leaf nodes instead of all tree nodes while preserving regular octrees' hierarchical structure. Linear octrees can be advantageous for robotics in static environments, which require infrequent map updates and fast collision checking. However, maintaining sparsity in dynamic environments can be expensive, and fine-grained voxelization is still needed in cluttered environments. These currently available approaches for occupancy mapping are usually time- or memory-consuming. Even though, some advanced data structures can save time or memory, it can still be expensive to add new obstacles in the map representation. Also, the representation of obstacles in the map is usually limited to cells of equal size (e.g., voxels). Therefore, improved technology for occupancy mapping is needed.

Embodiments of the present disclosure may improve on at least some of the challenges and issues described above by mapping occupancy and detecting collision based on geometric entities with hierarchical relationships. A geometric entity may be a geometric shape representing a volumetric space, such as a space occupied by an object or part of an object. The geometric shape may be one-dimensional, two-dimensional, three-dimensional, and so on. An object may be represented by a group of geometric entities with hierarchical relationships. The group of geometric entities may be referred to as an occupancy representation of the object. The hierarchical relationships may be represented by a tree structure (also referred to as hierarchical structure) where the geometric entities are arranged in different levels (also referred to as hierarchy levels).

In various embodiments of the present disclosure, an occupancy mapping system can map spaces occupied by objects. The occupancy mapping system may generate an occupancy representation of an object based on a point cloud of the object. The point cloud may be generated by one or more sensors detecting at least part of the object. The occupancy representation includes geometric entities on different hierarchy levels. In an example, the occupancy mapping system may generate a group of first geometric entities on a first level based on the point cloud. Each first geometric entity includes one or more points in the point cloud. The system may also generate one or more second geometric entities on a second level based on the plurality of first geometric entities. Each second geometric entity includes one or more first geometric entities.

The occupancy representation may have a tree structure representing the hierarchy between the geometric entities in the occupancy representation. For example, the first geometric entities may be on the lowest level, and the one or more second geometric entities may be on the next level. The occupancy mapping system may generate one or more additional geometric entities on one or more higher levels till a geometric entity including the entire point cloud is generated. The last-generated geometric entity may be on the highest level in the tree structure.

The occupancy mapping system can also detect collision of objects using the occupancy representations of the objects, e.g., in applications such as computer graphics or robotic motion planning. Collision detection by the occupancy mapping system may include detection of collision that is happening, is about to happen, or has already happened. The occupancy mapping system may use the hierarchical structures of the occupancy representations of the object to detect collision. In an example, the occupancy mapping system may determine whether a geometric entity of a first object intersects with a geometric entity of a second object. The geometric entity of each object may be in a higher hierarchy level than one or more other geometric entities of the object. After determining that the two geometric entities do not overlap, the occupancy mapping system may determine that the two objects do not collide. The collision detection may end here, even though the occupancy mapping system may perform another collision detection when or after one or both objects move.

After determining that the two geometric entities intersect (which indicates that there may be a collision), the occupancy mapping system may further determine whether a lower-hierarchy geometric entity of the first object intersects with a lower-level geometric entity of the second object. This may continue till the occupancy mapping system determines whether a lowest-level geometric entity of the first object intersects with a lowest-level geometric entity of the second object. The occupancy mapping system may determine that there is no collision based on a determination that the lower- (or lowest-) hierarchy geometric entity does not overlap with the lower- (or lowest-) hierarchy geometric entity of the second object. The occupancy mapping system may determine that there is collision based on a determination that the lowest-hierarchy geometric entity overlaps with the lowest-hierarchy geometric entity of the second object.

The present disclosure provides an approach that can represent volumes (including complex volumes) with geometric entities organized in an efficient data structure, e.g., a tree structure. The approach may use a hash function to get a geometric entity's semantic information, such as occupancy, velocity, class labeling, and so on. The approach can efficiently detection collision. For instance, collision detection can be reduced to hashing the occupancy representations of the objects and checking intersection between geometric entities in the occupancy representations. A learning-based method may be used in the approach to generates geometric entities from point-clouds input data. The approach can also provide signed distance between geometric entities and robot links and create a signed distance field accordingly. Compared with currently available occupancy mapping technologies, the present disclosure provides a more advantageous approach for occupancy mapping and collision detection.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicates that different instances of like objects are being referred to and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

The terms "substantially," "close," "approximately," "near," and "about," generally refer to being within +/−20% of a target value based on the input operand of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the input operand of a particular value as described herein or as known in the art.

In addition, the terms "comprise," "comprising," "include," "including," "have," "having" or any other variation thereof, are intended to cover a non-exclusive inclusion. For example, a method, process, device, or system that comprises a list of elements is not necessarily limited to only those elements but may include other elements not expressly listed or inherent to such method, process, device, or DNN accelerators. Also, the term "or" refers to an inclusive "or" and not to an exclusive "or."

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

Example Occupancy Mapping Environment

FIG. 1 illustrates an example occupancy mapping environment 100, in accordance with various embodiments. In the occupancy mapping environment 100, the occupancy of an object 110 in a space is mapped by an occupancy mapping system 130. For the purpose of illustration, the object 110 is a robot arm that can move, e.g., by using an actuator controlled by software codes. In other embodiments, the object 110 may be other types of movable objects, such as other types of robots, humans, animals, vehicles, planes, and so on. The object 110 may also be unmovable objects, such as furniture, building, plants, and so on. The object 110 may include multiple pieces, which may be connected or disconnected.

A point cloud 120 is generated by one or more sensors detecting the object 110. The one or more sensors may be camera, LIDAR (light detection and ranging), other types of sensors, or some combination thereof. The point cloud 120 includes a plurality of discrete points, each of which may correspond to a respective portion of the object 110. The occupancy mapping system 130 receives the point cloud 120 and generates an occupancy representation 140 of the object 110. Certain aspects of the occupancy mapping system 130 are described below in conjunction with FIGS. 2 and 3.

The occupancy representation 140 includes geometric entities 150A-150G, 160A-160C, and 170. For the purpose of illustration, each geometric entity in the occupancy representation 140 has a shape of sphere is shown as a circle or oval in FIG. 1. In other embodiments, the geometric entities 150A-150G, 160A-160C, and 170 may have other shapes, such as other three-dimensional shapes (e.g., ellipsoid, cylinder, cone, cube, cuboid, tetrahedron, pyramid, triangular prism, hexagonal prism, etc.), two-dimensional shapes (e.g., circle, oval, triangle, square, rectangular, parallelogram, trapezoid, pentagon, hexagon, octagon, etc.), one-dimensional shapes (e.g., straight line, curved line, crossed lines, etc.), and so on. The occupancy representation 140 has three hierarchy levels: the geometric entities 150A-150G are in the first level (i.e., the lowest level), the geometric entities 160A-160C are in the second level (i.e., the middle level), and the geometric entity 170 is in the third level (i.e., the highest level). A geometric entity in a lower level is contained by a geometric entity in a higher level. For instance, the geometric entities 150A and 150B are contained in the geometric entity 160A, the geometric entities 150C and 150D are contained in the geometric entity 1606, and the geometric entities 150E-150G are contained in the geometric entity 160C. Also, the geometric entities 160A-160C are contained in the geometric entity 170. In other embodiments, the occupancy representation 140 may include a different number of levels or a different number of geometric entities in a level.

In some embodiments, the geometric entities 150A-150G have smaller sizes than the geometric entities 160A-160C and the geometric entity 170. In an example, each of the geometric entities 150A-150G may have a radius that is smaller than radiuses of the geometric entities 160A-160C and the geometric entity 170. The radius of one or more of the geometric entities 150A-150G may define a resolution of the occupancy representation 140. The geometric entity 170 may define the maximum occupancy of the object 110 in an environment (e.g., a local area) where the object 110 is located. The occupancy representation 140 may be used (e.g., by the occupancy mapping system 130) to detect collision between the object 110 with one or more other objects or to determine whether the object 110 is an obstacle or have an obstacle in the environment.

Example Occupancy Mapping System

Figure 2:
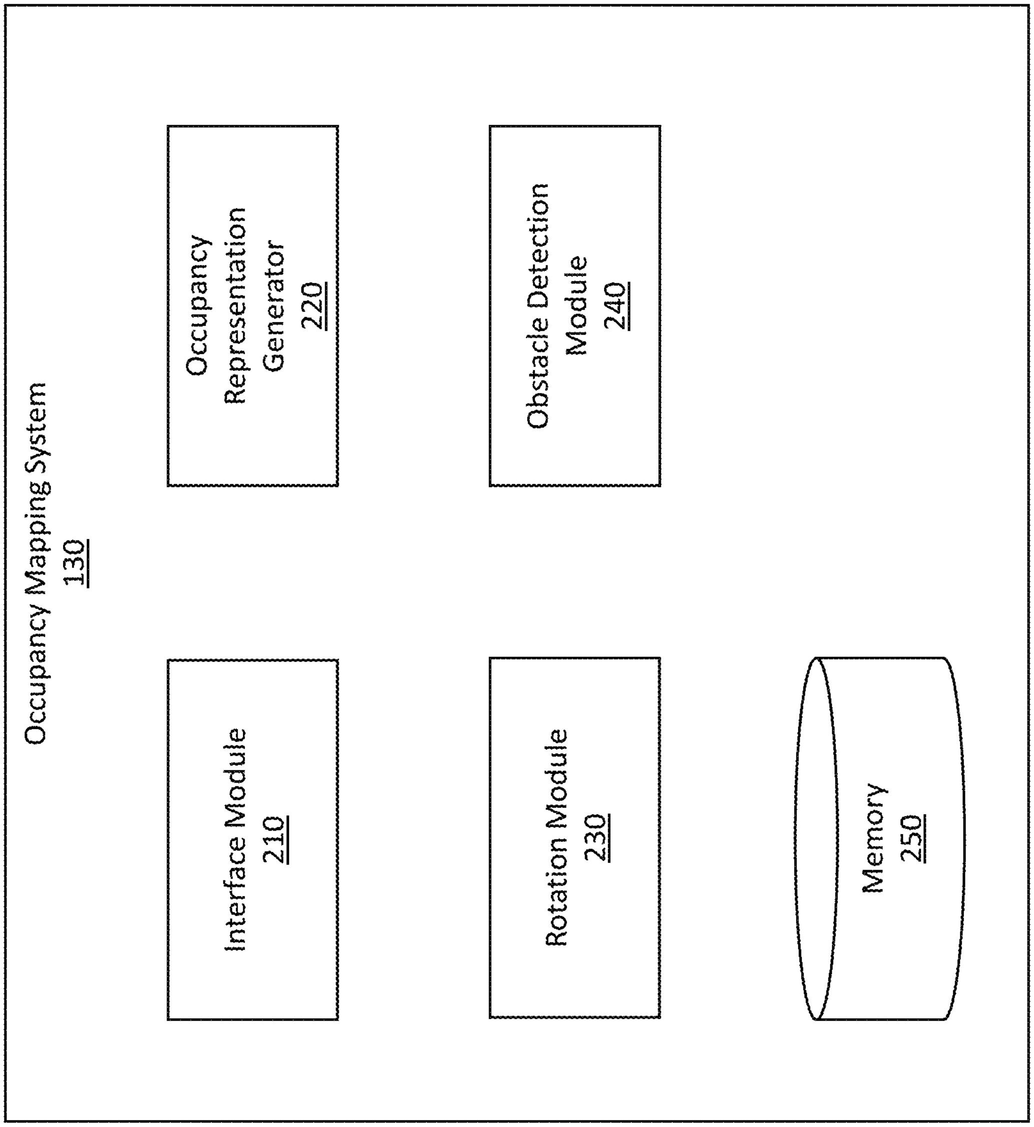
FIG. 2 is a block diagram of an occupancy mapping system, in accordance with various embodiments.

FIG. 2 is a block diagram of an occupancy mapping system 130, in accordance with various embodiments. The occupancy mapping system 130 includes an interface module 210, an occupancy representation generator 220, a rotation module 230, an obstacle detection module 240, and a memory 250. In other embodiments, alternative configurations, different or additional components may be included in the occupancy mapping system 130. Further, functionality attributed to a component of the occupancy mapping system 130 may be accomplished by a different component included in the occupancy mapping system 130 or by a different system.

The interface module 210 facilitates communications of the occupancy mapping system 130 with one or more other systems. For example, the interface module 210 may receive point clouds, e.g., from one or more sensors that can detect objects and output point clouds. As another example, the interface module 210 may receive occupancy representations from other systems, such as occupancy representations that can be used by the occupancy mapping system 130 to detect collision. In some embodiments, the interface module 210 may store the received information in the memory 250. The interface module 210 may also send occupancy representations generated by the occupancy mapping system 130 to other systems.

The occupancy representation generator 220 generates occupancy representations of objects. In some embodiments, the occupancy representation generator 220 generates occupancy representations by using geometric algebra, such as Conformal Geometric Algebra (CGA). An occupancy representation may be a representation of an object or one or more portions of an object. The occupancy representation may include a plurality of geometric entities arranged in a hierarchical structure, such as a tree structure. For instance, the occupancy representation includes a group of geometric entities in the first level (i.e., the lowest level) and one or more other geometric entities in one or more higher levels.

In some embodiments, the occupancy representation generator 220 may generate one or more geometric entities in the first level based on a point cloud of the object. The occupancy representation generator 220 may define the points in the point cloud in a representation space. A point may be contained by (i.e., inside or on the perimeter of) a geometric entity in the first level. The dimension of a geometric entity in the first level may indicate a minimum discretization dimension of the occupancy representation. In some embodiments, the dimension of a geometric entity in the first level may indicate a resolution of the occupancy representation.

The occupancy representation generator 220 may further generate one or more geometric entities in the one or more higher levels based on the geometric entities in the first level. A geometric entity in a higher level may be a parent of one or more geometric entities in the immediately lower level. A parent geometric entity may contain its child geometric entities (or child geometric entity) in a representation space defined by the occupancy representation generator 220. Geometric entities in the same level may intersect. In some embodiments, the highest level may include a single geometry entity, and the single geometry entity may contain all the geometry entities in the lower level(s). The single geometry entity in the highest level may represent the largest possible occupancy of the object in the representation space.

Geometric entities may have various shapes, such as three-dimensional shapes (e.g., sphere, ellipsoid, cylinder, cone, cube, cuboid, tetrahedron, pyramid, triangular prism, hexagonal prism, etc.), two-dimensional shapes (e.g., circle, oval, triangle, square, rectangular, parallelogram, trapezoid, pentagon, hexagon, octagon, etc.), one-dimensional shapes (e.g., straight line, curved line, crossed lines, etc.), other shapes, or some combination thereof. In some embodiments, all the geometric entities in an occupancy representation may have the same shape. In other embodiments, the geometric entities in an occupancy representation may have different shapes.

The rotation module 230 may translate or rotate occupancy representations of objects. In some embodiments, the rotation module 230 may translate or rotate an occupancy representation by using a motor operation:

$$M = e^{-\frac{\theta}{2}L},$$

where L is the rotational axis with rotation θ. The rotation module 230 may apply the motor operation on an occupancy representation of a dynamic object. A dynamic object may be movable. The occupancy of a dynamic object can change. In some embodiments, the rotation module 230 may request the occupancy representation generator 220 to generate a new occupancy representation of an object as the object moves or changes its pose (position or orientation).

The obstacle detection module 240 detects obstacles based on occupancy representations from the occupancy representation generator 220, the rotation module 230, or the interface module 210. For instance, the obstacle detection module 240 may determine whether an object is, could be, or will be an obstacle of one or more other object based on the occupancy representation of the object or based on the occupancy representations of all the objects. In some embodiments, the object is an obstacle of another object in scenarios where the object has collided, is colliding, or will collide with the other object or in scenarios where the object can interfere with a movement of the other object, for instance, the object blocks a route along which the other object travels.

In some embodiments, the obstacle detection module 240 may use hierarchical structures in occupancy representations for obstacle detection. In an example where the obstacle detection module 240 determines whether a target object is an obstacle or have an obstacle in an environment, the obstacle detection module 240 may receive an occupancy representation of the target object ("target occupancy representation") and occupancy representation(s) of one or more other objects in the environment ("reference occupancy representation(s)"). For each of the other objects, the obstacle detection module 240 may determine whether any geometric entity in the highest level ($L_{MAX}$) of the target occupancy representation intersects with any geometric entity in the highest level of the reference occupancy representation. After determining that there is no intersection between the target object and each of the other objects at the highest levels, the obstacle detection module 240 can determine that the object is not an obstacle or have no obstacle in the environment.

After determining that there is intersection between the target object and an object at the highest level, the obstacle detection module 240 may further determine whether any geometric entity in the next level (e.g., one level lower than the highest level, $L_{MAX-1}$) of the target occupancy representation intersects with any geometric entity in the next level (e.g., one level lower than the highest level, $L_{MAX-1}$) of the reference occupancy representation. A geometric entity in the next level may be contained in the geometric entity in the highest level where the intersection was found. After determining that there is no intersection in the next level, the obstacle detection module 240 can determine that the object is not an obstacle or have no obstacle in the environment. After determining that there is intersection in the next level, the obstacle detection module 240 may detection between the geometric entities in $L_{MAX-2}$ of the target occupancy representation and the reference occupancy representation. This procedure may continue till the obstacle detection module 240 either reaches a level where there is no intersection or reaches the lowest level ($L_0$).

In some embodiments, to determine whether a geometric entity in a level of the target occupancy representation intersects with a geometric entity in a level of a reference occupancy representation, the obstacle detection module 240 may compute a wedge produce of the two geometric entities. The obstacle detection module 240 may also compute a square of the wedge product and compare the square of the wedge product against the level of the target occupancy representation. For instance, the obstacle detection module 240 compares the square of the wedge produce with a limit bound of the level of the target occupancy representation. The obstacle detection module 240 may determine that there is no intersection based on a determination that the square of the wedge product is greater than the limit bound. Otherwise, the obstacle detection module 240 may determine that there is intersection.

In some embodiments (e.g., embodiments where the geometric entities are spheres), the limit bound may be denoted as $r_b$:

$$r_b = r_i^4 - 0.25r_i^4,$$

where $r_i$ is the radius of one or more geometric entities in the level of the target occupancy representation, and i is the index of the level in the hierarchical structure of the target occupancy representation, i may be an integer in the range from 0 to MAX. In embodiments where the level the lowest level ($L_0$) of the occupancy representation, $r_i$ may be referred to as $r_{min}$, which may indicate a resolution of the occupancy representation.

The memory 250 stores data associated with the occupancy mapping system, such as data received or generated by the occupancy mapping system 130. Even though FIG. 2 shows one memory 250, the occupancy mapping system 130 may have multiple memories, which may have different storage sizes, bandwidth, or speeds. An embodiment of the memory 250 may be the memory 1004 in FIG. 10.

Figure 3:
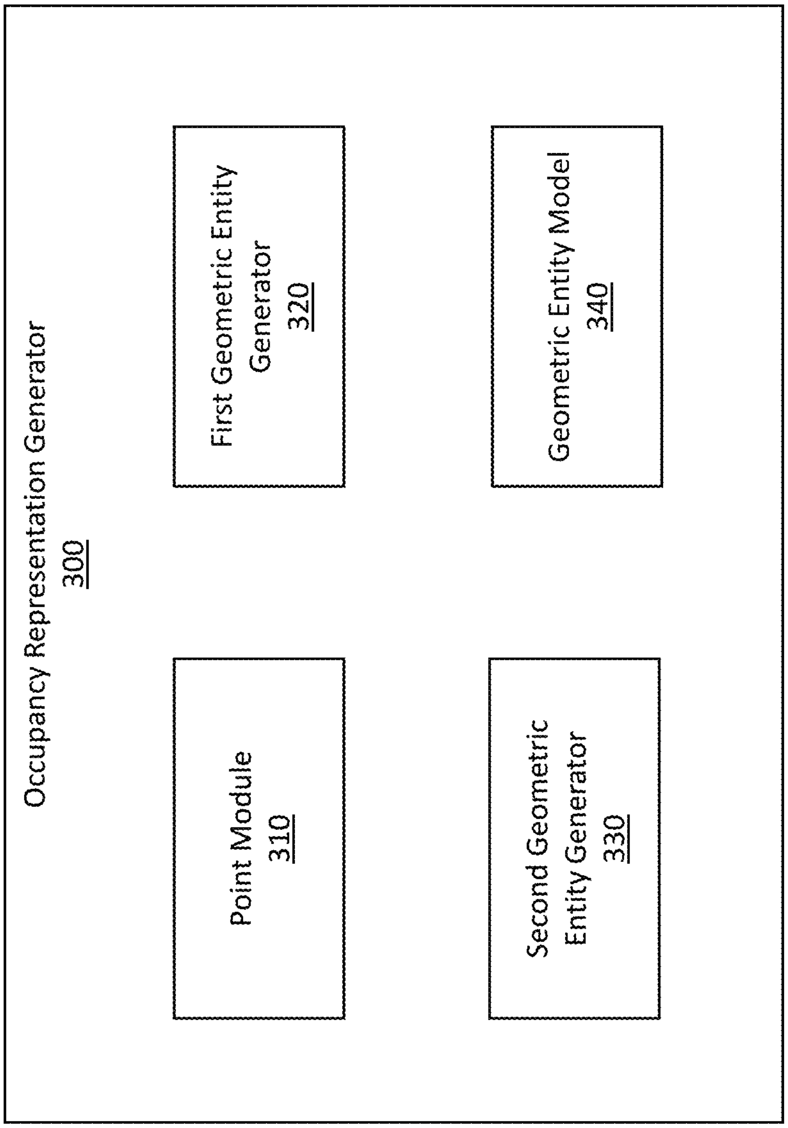
FIG. 3 is a block diagram of an occupancy representation generator, in accordance with various embodiments.

FIG. 3 is a block diagram of an occupancy representation generator 300, in accordance with various embodiments. The occupancy representation generator 300 may generate occupancy representations of objects, such as occupancy representation including geometric entities organized in hierarchical structures. The geometric entities may have various shapes, such as three-dimensional shapes (e.g., sphere, ellipsoid, cylinder, cone, cube, cuboid, tetrahedron, pyramid, triangular prism, hexagonal prism, etc.), two-dimensional shapes (e.g., circle, oval, triangle, square, rectangular, parallelogram, trapezoid, pentagon, hexagon, octagon, etc.), one-dimensional shapes (e.g., straight line, curved line, crossed lines, etc.), other shapes, or some combination thereof. For the purpose of illustration, sphere is used as an example shape of the geometric entities in the description of various embodiments in conjunction with FIG. 3. The occupancy representations may be used for various tasks, such as collision detection, path planning, modeling, searching, and so on.

The occupancy representation generator 300 may be an embodiment of occupancy representation generator 220 in FIG. 2. As shown in FIG. 3, the occupancy representation generator 300 includes a point module 310, a first geometric entity generator 320, a second geometric entity generator 330, and a geometric entity model 340. In other embodiments, alternative configurations, different or additional components may be included in the occupancy representation generator 300. Further, functionality attributed to a component of the occupancy representation generator 300 may be accomplished by a different component included in the occupancy representation generator 300, a component of the occupancy mapping system 130, or by a different system.

The point module 310 obtains a point cloud for an object. The point cloud may be generated based on data from one or more sensors that have detected at least part of the object. The one or more sensors may include depth camera, LIDAR, other types of sensors, or some combination thereof. In some embodiments, the point module 310 generates the point cloud. For example, the point module 310 receives sensor data from the one or more sensors and generates the point cloud based on the sensor data. As another example, the point module 310 receives multiple point clouds, each of which may be generated from a detection of a different part of the object. The point module 310 may generate the point cloud of the object by merging the multiple point clouds. In other embodiments, the point module 310 receives the point cloud from the one or more sensors or a system associated with the one or more sensors.

The point module 310 may identify some or all of the points in the point cloud. For each respective point that the point module 310 identifies, the point module 310 may determine a representation of the point in a representation space using a geometric algebra, such as CGA. In an example, the representation space may be denoted as $G_{4,1}$. A geometric representation of the point in the representation space $x_c \in G_{4,1}$ may be denoted as:

$$x_c = x_e + \frac{1}{2}x_e^2 e_\infty + e_0,$$

where $x_e \in \mathbb{R}^3$, $\mathbb{R}^3$ denotes the base space, and $e_0$ and $e_\infty$ are two null vectors that may be basis vectors in the base space. In some embodiments, $$e_\infty = e_- + e_+$$

$$e_0 = (e_- - e_+)/2$$

where $e_-$ and $e_+$ are two basis vectors that are orthogonal to the base space and to each other. The representation space $G_{4,1}$ may be created with $e_-^2=-1$ and $e_+^2=+1$. In other embodiments, the point module 310 may use a different representation space. For instance, the point module 310 may determine the representation space based on a shape of geometric entities to be generated by the first geometric entity generator 320 or the second geometric entity generator 330. For instance, the point module 310 may use a representation space $G_{6,3}$ for geometric entities having a shape of ellipsoid.

The first geometric entity generator 320 generates geometric entities based on the points identified by the point module 310. The geometric entities may be on the lowest level in the hierarchical structure of the occupancy representation of the object. The first geometric entity generator 320 may determine one or more shapes of the geometric entities. In some embodiments, the first geometric entity generator 320 determines a single shape for all the geometric entities. In other embodiments, the first geometric entity generator 320 determines different shapes for different geometric entities. The first geometric entity generator 320 may determine a shape based on various factors, such as one or more attributes of the object, one or more attributes of the environment where the object is located, one or more attributes of another object is associated with the object, the type of task(s) to be performed using the occupancy representation, other factors, or some combination thereof. An attribute may be size, shape, material, function, etc.

In some embodiments, the first geometric entity generator 320 may generate a geometric entity based on one or more points in the point cloud. In an example, the first geometric entity generator 320 may generate a sphere by using a point as the center of the sphere. The first geometric entity generator 320 may start with randomly selecting a point from the point cloud. In the base space $\mathbb{R}^3$, a sphere with a center at $p_e \in \mathbb{R}^3$ and radius $\rho \geq 0$ may $$(x_e - p_e)^2 = \rho^2$$

where $x_e \in \mathbb{R}^3$. The sphere can be mapped to $G_{4,1}$ as $$s = p_c - \frac{1}{2}\rho^2 e_\infty$$

where, $p_c \in G_{4,1}$ is the center of the sphere. The first geometric entity generator 320 may determine the radius $\rho$ of the sphere, e.g., based on a predetermined or expected resolution of the occupancy representation of the object. The radius may be a minimum radius $r_{min}$ of discretization in the occupancy representation of the object. This representation may correspond to the Inner Product Null Space (IPNS). When $\rho=0$, the sphere become a point, that is, $s=p_c$.

In another example, the first geometric entity generator 320 may generate a sphere based on multiple points. For instance, the first geometric entity generator 320 may generate a sphere based on a wedge product of the geometric representations of multiple points. In an embodiment where the first geometric entity generator 320 generates a sphere based on four points, the sphere may be denoted as:

$$s^* = x_{c_1} \wedge x_{c_2} \wedge x_{c_3} \wedge x_{c_4}.$$

Considering the pseudo-scalar I, the dual of the sphere may be denoted as: $s^*=sI$, which may be represented as a 4-vector. When there are two spheres $s_1, s_2 \in G_{4,1}$, the first geometric entity generator 320 may obtain a circle z, which is the intersection of $s_1$ and $s_2$. The circle z may be denoted as:

$$z = s_1 \wedge s_2$$

which is given in IPNS. The dual of the circle may be denoted by three points lying on the circle:

$$z^* = x_{c_1} \wedge x_{c_2} \wedge x_{c_3}.$$

When the two spheres do not intersect, the first geometric entity generator 320 may obtain an imaginary circle with a negative radius.

After the first geometric entity generator 320 generates a sphere, the first geometric entity generator 320 may determine whether one or more points are outside the sphere. For instance, the first geometric entity generator 320 may determine whether a wedge product between the geometric representation of a point and the sphere is negative. After or in response to determining that the wedge product is positive or zero, the first geometric entity generator 320 may determine that the point is contained by the sphere (i.e., inside the sphere or on the perimeter of the sphere). The first geometric entity generator 320 may also remove the point from the list and use the point to increase the occupancy uncertainty of the sphere. After or in response to determining that the wedge product is negative, the first geometric entity generator 320 may determine that the point is outside the sphere and may generate a new sphere based on the point. This procedure may continue till all the points in the point cloud is consumed, i.e., every point is either in a sphere or lies on the perimeter of a sphere. Some spheres generated by the first geometric entity generator 320 may intersect or touch each other.

In some embodiments, the first geometric entity generator 320 may use the geometric entity model 340 to generate the geometric entities. The first geometric entity generator 320 may input the point cloud into the geometric entity model 340, and the geometric entity model 340 outputs a group of geometric entities. In some embodiments, the first geometric entity generator 320 may input other information into the geometric entity model 340, such as information regarding one or more attributes of the object, one or more attributes of the environment where the object is located, one or more attributes of another object is associated with the object, the type of task(s) to be performed using the occupancy representation, and so on. The geometric entity model 340 may be capable of generating geometric entities of various shapes, such as sphere, ellipsoid, quartic, plane, line, and so on.

In an example, the input to the geometric entity model 340, e.g., a point cloud, may be a graphical model denoted as G=(V, E). The graphical model may be a partial graph ˜G, e.g., in scenarios that a complete graphical model may be unavailable. Each of the graph vertices V may have an associated conformal point P, such that P∧S=0, when S is one of the geometric entities. The geometric entity model 340 may parameterize the conditional distribution p(G|˜G) using one or more neural networks, such as graph neural network (GNN). The conditional distribution p(G|˜G) may be denoted as:

$$p_\theta(G \mid \tilde{G}) = \int p_\theta(G \mid \tilde{G}, z) p_\theta(z \mid \tilde{G}) dz$$

$$p_\theta(G \mid \tilde{G}, z) = \prod_{i=1}^{N} (p_i \mid \tilde{G}, z_i), \text{ with } p_\theta(p_i \mid \tilde{G}, z_i) = N(p_i \mid \mu_i, I)$$

$$p_\theta(z \mid \tilde{G}) = \prod_{i=1}^{N} (z_i \mid \tilde{G}), \text{ with } p_\theta(z_i \mid \tilde{G}) = \sum_{k=0}^{K} \pi_{k,i} N(\mu_{k,i}, \operatorname{diag}(\sigma_{k,i}^2))$$

where z is a stochastic latent variable and p are the conformal points for all the point cloud with size N. The points may follow a normal distribution with mean μ, which the geometric entity model 340 may be trained to predict. The prior distribution is parameterized as a Gaussian mixture model with K components. These Gaussians may have mean $\mu_k$, diagonal covariance $\sigma_k$, and mixing coefficient $\pi_k$, which are an output of the geometric entity model 340.

The geometric entity model 340 may be trained to maximize the evidence lower bound (ELBO) of the marginal likelihood, or evidence of the data, based on an expectation with respect to the inference distribution $q_\varnothing$:

$$q_\phi(z \mid G) = \prod_{i=1}^{N} q_\phi(z_i \mid G), \text{ with } q_\phi(z_i \mid G) = N(z_i \mid \mu_i, \operatorname{diag}(\sigma_i^2))$$

In some embodiments, the geometric entity model 340 can preserve the inner products of the conformal points. In an example, one or more layers of the geometric entity model 340 may preserve the structure of the conformal entities by using:

$$m_{i,j} = \Phi_e(h_i^j, h_j^l, (p_i^l \cdot p_j^l), a_{i,j})$$

$$p_i^{l+1} = p_i^l + C \sum_{j \neq i} (p_i^l \wedge p_j^l \wedge e_\infty) \Phi_x(m_{i,j})$$

$$m_i = \sum_{j \in N(i)} m_{i,j}$$

$$h_i^{l+1} = \Phi_h(h_i^l, m_i)$$

where h are the node embeddings and $a_{i,j}$ are edge values. The loss for training may be defined as the binary cross entropy between the estimated and ground-truth nodes.

The first geometric entity generator 320 may include or otherwise be associated with a training module that trains the geometric entity model 340 with machine learning techniques. As part of the generation of the geometric entity model 340, the training module may form a training set. The training set may include training samples and ground-truth labels of the training samples. A training sample may include one or more point clouds of an object. The training sample may have one or more ground-truth labels, e.g., geometric entities in one or more verified occupancy representations of the object. In some embodiments, the training set may include synthetic data using randomly generated geometric entities at random positions relative to a sensor model that can produce point clouds. The training module extracts feature values from the training set, the features being variables deemed potentially relevant to occupancy mapping. An ordered list of the features may be a feature vector. In some embodiments, the training module may apply dimensionality reduction (e.g., via linear discriminant analysis (LDA), principal component analysis (PCA), or the like) to reduce the amount of data in the feature vectors for ride services to a smaller, more representative set of data. The training module may use supervised machine learning to train the model. Different machine learning techniques—such as linear support vector machine (linear SVM), boosting for other algorithms (e.g., AdaBoost), neutral networks, logistic regression, naïve Bayes, memory-based learning, random forests, bagged trees, decision trees, boosted trees, or boosted stumps—may be used in different embodiments.

In some embodiments, the first geometric entity generator 320 or the geometric entity model 340 may use one or more segmentation criteria to generate geometric entities. The segmentation criteria may vary based on the use case. In an example use case for navigation (e.g., collision avoidance, path planning, etc.), the first geometric entity generator 320 or the geometric entity model 340 may use volumetric geometric entities with subspace dimensions. In another example use case for manipulation (e.g., modeling or estimating contact points, non-contacting elements, orientated surfaces, etc.), the first geometric entity generator 320 or the geometric entity model 340 may use an online selection of number of points. The geometric entity model 340 may regress primitives. In yet another example use case for shape modeling (e.g., modeling occupancy or surfaces which may be based on the object's curvature, topology, etc.), the first geometric entity generator 320 or the geometric entity model 340 may use dual minimizing volume while ensuring a minimal number of points. In yet another example use case for articulated objects (e.g., offline modeling for search in regions, etc.), the first geometric entity generator 320 or the geometric entity model 340 may use offline number of points. The geometric entity model 340 may regress primitives.

The second geometric entity generator 330 generates one or more geometric entities based on the geometric entities generated by the first geometric entity generator 320. In some embodiments, a geometric entity generated by the second geometric entity generator 330 has a higher hierarchy than one or more geometric entities generated by the first geometric entity generator 320. For instance, in a tree structure of the occupancy representation of the object, the geometric entity generated by the second geometric entity generator 330 is on a higher level than one or more geometric entities generated by the first geometric entity generator 320. For the purpose of illustration, the geometric entities generated by the first geometric entity generator 320 are referred to as $L_0$ (level zero) geometric entities, geometric entities generated by the second geometric entity generator 330 are referred to as $L_N$ geometric entities, where N is a positive number and the value of N depends on the hierarchy levels of the geometric entities. A $L_0$ geometric entity may be inside a $L_1$ geometric entity, in which case the $L_0$ geometric entity is the child and the $L_1$ geometric entity is the parent. Similarly, a $L_1$ geometric entity may be inside a $L_2$ geometric entity, in which case the $L_1$ geometric entity is the child and the $L_2$ geometric entity is the parent.

In some embodiments, the second geometric entity generator 330 receives $L_0$ geometric entities and selects (e.g., randomly selects) a $L_0$ geometric entity, such as a sphere $s_r$, for generating a $L_1$ geometric entity. The second geometric entity generator 330 may generate a $L_1$ sphere based on the sphere $s_r$. The center of the $L_1$ sphere may be inside the sphere $s_r$. In an embodiment, the $L_1$ sphere has the same center as the sphere $s_r$. The $L_1$ sphere has a greater radius than the sphere $s_r$. In an example, the radius of the $L_1$ sphere may be twice the radius of the sphere $s_r$. The $L_1$ sphere contains the sphere $s_r$. The second geometric entity generator 330 may also identify one or more other $L_0$ spheres that intersect with the sphere $s_r$. For instance, the second geometric entity generator 330 may compute a wedge product between the sphere $s_r$ and another $L_0$ sphere. The second geometric entity generator 330 may compare a square of the wedge product with a limit bound $r_b$:

$$r_b = r_{min}^4 - 0.25r_{min}^4,$$

The second geometric entity generator 330 may determine that the $L_0$ sphere is contained in the $L_1$ sphere based on a determination that the square of the wedge product is less or equal to the limit bound $r_b$. The $L_0$ sphere is a child of the $L_1$ sphere.

The second geometric entity generator 330 may determine that a $L_0$ sphere is not contained in the $L_1$ sphere based on a determination that the square of the wedge product is greater than the limit bound $r_b$. The $L_0$ sphere is not a child of the $L_1$ sphere. The second geometric entity generator 330 may generate another $L_1$ sphere based on the $L_0$ sphere or based on another $L_0$ sphere. The second geometric entity generator 330 may repeat this procedure till all the $L_0$ spheres are consumed. For instance, the procedure may end after every single $L_0$ sphere is contained in a $L_1$ sphere.

In some embodiments, $L_1$ may be the highest hierarchy level in the occupancy representation of the object. In other embodiments, there may be one or more higher levels, and the second geometric entity generator 330 may generate one or more additional spheres. For instance, the second geometric entity generator 330 may generate one or more $L_2$ spheres based on $L_1$ spheres, e.g., by using the method of generating the $L_1$ spheres based on the $L_0$ spheres. A $L_2$ sphere may be the parent of and contain one or more $L_1$ spheres. The second geometric entity generator 330 may also generate one or more $L_3$ spheres based on $L_2$ spheres. This procedure may continue till the highest hierarchy level $L_{MAX}$ is reached. The highest hierarchy level $L_{MAX}$ may include a single geometric entity that contains all the geometric entities in the lower level(s). In some embodiments, the minimum discretization radius $r_{min}$ and the highest hierarchy level $L_{MAX}$ may be known before the execution of the first geometric entity generator 320 or the second geometric entity generator 330, the second geometric entity generator 330 may compute certain values offline. For instance, the limit bounds ($r^4-0.25r^4$) for $L_0$ to $L_{MAX}$ may be computed offline.

Example Process of Generating Occupancy Representation

Figure 4:
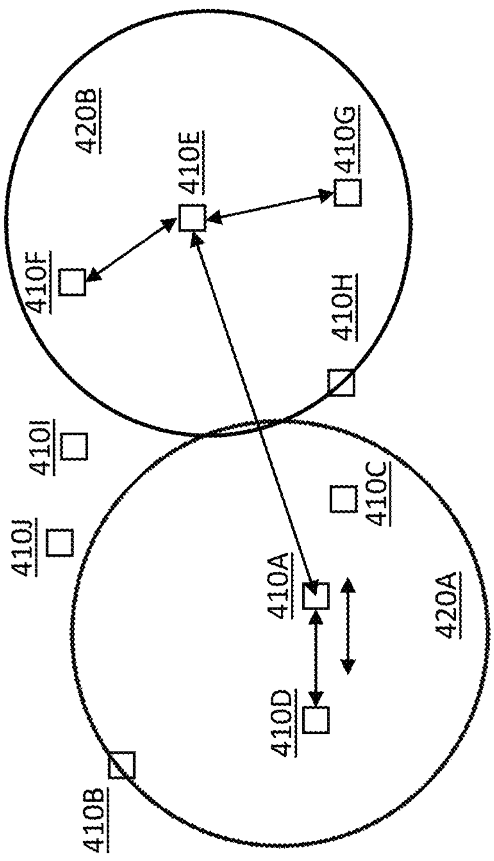
FIG. 4 illustrates generation of lowest-level geometric entities, in accordance with various embodiments.

FIG. 4 illustrates generation of lowest-level geometric entities 420A and 420B, in accordance with various embodiments. The generation of the lowest-level geometric entities 420A and 420B may be performed by the occupancy representation generator 300 in FIG. 3, such as the first geometric entity generator 320 in the occupancy representation generator 300. For the purpose of illustration, the lowest-level geometric entities 420A and 420B are spheres. In other embodiments, the lowest-level geometric entity 420A or 420B may have a different shape. FIG. 4 also shows points 410A-410J (collectively referred to as "points 410" or "point 410"). The points 410 may be from a point cloud that is generated by detecting an object. The lowest-level geometric entities 420A and 420B are part of an occupancy representation of the object.

To generate the lowest-level geometric entities 420A and 420B, a point 410A is selected. The lowest-level geometric entity 420A is generated by using the point 410A as the center and by using a predetermined radius as the radius. The predetermined radius may be the radius of the minimum discretization in the occupancy representation. In some embodiments, the predetermined radius may be determined based on a predetermined resolution of the occupancy representation. After the lowest-level geometric entity 420A is generated, a wedge product of each of the points 420B-420J and the lowest-level geometric entity 420A is computed. A point 410, whose wedge product with the lowest-level geometric entity 420A is positive or equal to zero, is contained by the lowest-level geometric entity 420A (i.e., inside the lowest-level geometric entity 420A or on the perimeter of the lowest-level geometric entity 420A). The point 410 may be used to increase the occupancy uncertainty of the lowest-level geometric entity 420A. A point 410, whose wedge product with the lowest-level geometric entity 420A is negative, is not contained by the lowest-level geometric entity 420A. As shown in FIG. 4, the points 410B-410D are contained by the lowest-level geometric entity 420A, but the points 410E-410J are not contained by the lowest-level geometric entity 420A.

The points 410E-410J are used to generate one or more other lowest-level geometric entities. For instance, the lowest-level geometric entity 420B is generated by using the point 410E as the center after it is determined that the point 410E is not contained by the lowest-level geometric entity 420A. The lowest-level geometric entity 420B may have the same radius as the lowest-level geometric entity 420A. After the lowest-level geometric entity 420B is generated, it is determined whether the points 410F-410J are contained by the lowest-level geometric entity 420B, e.g., based on the wedge product of the lowest-level geometric entity 420B with each of the points 410F-410J. It is determined that the points 410F-410H are contained by the lowest-level geometric entity 420B, but the points 410I and 410J are not contained by the lowest-level geometric entity 420B. Even though not shown in FIG. 4, one or more additional lowest-level geometric entities can be generated based on the points 410I and 410J. The generation of lowest-level geometric entities may continue till every point in the point cloud are contained in at least one lowest-level geometric entity.

Figure 5:
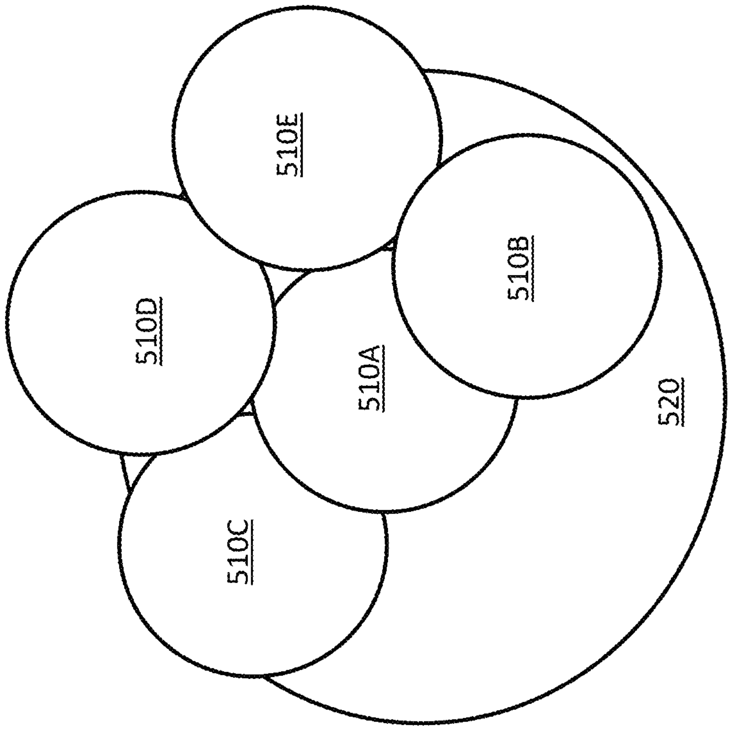
FIG. 5 illustrates generation of a higher-level geometric entity, in accordance with various embodiments.

FIG. 5 illustrates generation of a higher-level geometric entity 520, in accordance with various embodiments. The higher-level geometric entity 520 may be an embodiment of one of the geometric entities 160A-160C. FIG. 5 also shows lower-level geometric entities 510A-510E. The lower level may be one level down from the higher level. In some embodiments, the lower level may be any level but the highest level in the occupancy representation. In an example, the lower level may be the lowest level. For the purpose of illustration, the lower-level geometric entities 510A-510E and the higher-level geometric entity 520 are spheres. In other embodiments, the geometric entities may have other shapes. The generation of the higher-level geometric entity 520 may be performed by the second geometric entity generator 330 in FIG. 3.

In the embodiments of FIG. 5, the lower-level geometric entity 510A is selected. The higher-level geometric entity 520 may be generated with the center of the lower-level geometric entity 510A and a radius that is two times of the radius of the lower-level geometric entity 510A.

In some embodiments, it may be determined whether the lower-level geometric entity 510A intersects with any of the other lower-level geometric entities 510B-510E. For instance, a wedge product of the lower-level geometric entity 510A and each of the lower-level geometric entities 510B-510E may be computed. For a lower-level geometric entity that intersects with the lower-level geometric entity 510A, the wedge product may be a circle at the intersection of the two spheres.

$$z_1 = S_B \wedge S_A$$

$$z_2 = S_C \wedge S_A$$

$$z_3 = S_D \wedge S_A$$

$$z_4 = S_E \wedge S_A$$

where $S_A$ denotes the lower-level geometric entity 510A, $S_B$ denotes the lower-level geometric entity 5106, $S_C$ denotes the lower-level geometric entity 510C, $S_D$ denotes the lower-level geometric entity 510D, $S_E$ denotes the lower-level geometric entity 510E, $z_1$ denotes the circle at the intersection of the lower-level geometric entity 510A and the lower-level geometric entity 510B, $z_2$ denotes the circle at the intersection of the lower-level geometric entity 510A and the lower-level geometric entity 510C, $z_3$ denotes the circle at the intersection of the lower-level geometric entity 510A and the lower-level geometric entity 510D, and $z_4$ denotes the circle at the intersection of the lower-level geometric entity 510A and the lower-level geometric entity 510E. The wedge product of the lower-level geometric entity 510A and a lower-level geometric entity (not shown in FIG. 5) that does not intersect with the lower-level geometric entity 510A may be an imaginary circle with a negative radius.

For each of the lower-level geometric entities 510B-510E that intersect with the lower-level geometric entity 510A, the square of the wedge product may be computed and compared with a limit bound of the higher-level geometric entity 520.

$$r_b = r^4 - 0.25r^4$$

$$(S_B \wedge S_A)^2 \leq r_b$$

$$(S_C \wedge S_A)^2 > r_b$$

$$(S_D \wedge S_A)^2 > r_b$$

$$(S_E \wedge S_A)^2 > r_b$$

where $r_b$ denotes the limit bound, and r denotes the radius of the lower-level geometric entity 510A. The square of the wedge product for the lower-level geometric entity 5108 is lower than or equal to the limit bound, and it may be determined that the lower-level geometric entity 5108 is contained by the higher-level geometric entity 520. For each of the lower-level geometric entities 510C-510E, the square of the wedge product for the lower-level geometric entity 5108 is greater than the limit bound, and it may be determined that the lower-level geometric entities 510C-510E are not contained by the higher-level geometric entity 520. The lower-level geometric entities 510C-510E will be used to generate one or more other higher-level geometric entities (not shown in FIG. 5). The generation of higher-level geometric entities may end after each of the lower-level geometric entities 510A-510E are contained in at least one higher-level geometric entity.

In some embodiments, the higher level may not be the highest level of the occupancy representation. One or more other geometric entities may be generated based on the higher-level geometric entities that are generated based on the lower-level geometric entities 510A-510E, e.g., through a process similar to the generation of the higher-level geometric entity 520. In some embodiments, it may be determined that the highest level is reached after the generation of a single geometric entity that contains all the previously-generated geometric entities.

Figure 6:
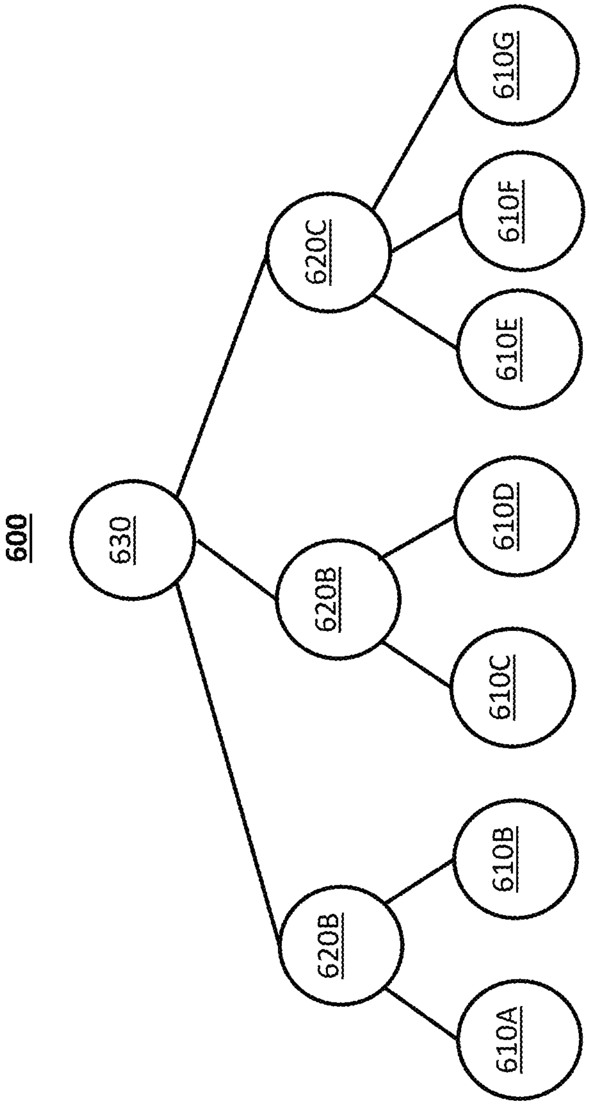
FIG. 6 illustrates an example tree structure of an occupancy representation, in accordance with various embodiments.

FIG. 6 illustrates an example tree structure 600 of an occupancy representation, in accordance with various embodiments. The tree structure 600 is a hierarchical structure of the occupancy representation. The occupancy representation includes geometric entities 610A-610G, 620A-620C, and 630. The occupancy representation may be an embodiment of the occupancy representation 140 in FIG. 1.

The tree structure 600 includes three hierarchy levels: the geometric entities 610A-610G are in the first level (i.e., the lowest level), the geometric entities 620A-620C are in the second level (i.e., the middle level), and the geometric entity 630 is in the third level (i.e., the highest level). A geometric entity in a lower level ("child" or "child geometric entity")

is contained by a geometric entity in a higher level ("parent" or "parent geometric entity"). Each parent is connected to its children in FIG. 6. The geometric entity 620A is the parent of the geometric entities 610A and 610B, the geometric entity 620B is the parent of the geometric entities 610C and 610D, and the geometric entity 620C is the parent of the geometric entities 610E-610G contained in. Also, the geometric entity 630 is the parent of the geometric entities 620A-620C. A parent geometric entity may be generated based on its child geometric entities, e.g., through a process similar to the one illustrated in FIG. 5. Even though FIG. 6 shows 11 geometric entities and three hierarchy levels, the tree structure 600 may include a different number of levels or a different number of geometric entities in a level.

Example Collision Detection

Figure 7:
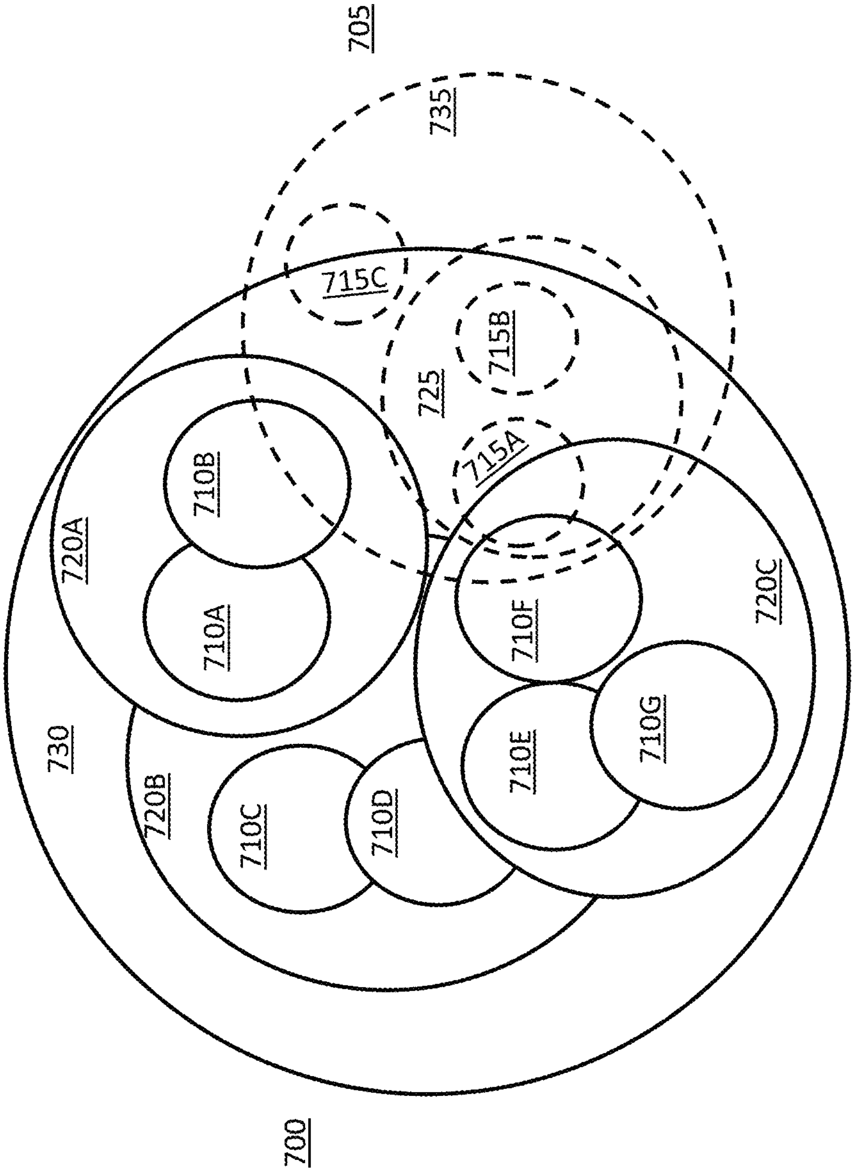
FIG. 7 illustrates collision detection based on occupancy representations, in accordance with various embodiments.

FIG. 7 illustrates collision detection based on occupancy representations 700 and 705, in accordance with various embodiments. The occupancy representations 700 and 705 may be generated by the occupancy representation generator 300 in FIG. 3. The occupancy representations 700 and 705 represent two objects, respectively, that are in the same environment. The two objects may be the same type of objects or different types of objects. The two objects may become obstacles to each other or collide with each other. The occupancy representation 700 includes geometric entities 710A-810G in the first hierarchy level, 720A-820C in the second hierarchy level, and 730 in the highest hierarchy level. The occupancy representation 705 includes geometric entities 715A-815C in the first hierarchy level, 725A in the second hierarchy level, and 735 in the highest hierarchy level. Each geometric entity in FIG. 7 is a sphere. In other embodiments, a geometric entity in the occupancy representation 700 or 705 may have a different shape. Also, the occupancy representation 700 or 705 may include a different number of geometric entities or a different number of hierarchy levels.

A collision between the two objects may be detected, e.g., by the obstacle detection module 240 in FIG. 2, based on the occupancy representations 700 and 705. For instance, the obstacle detection module 240 may detect intersection between the geometric entity 730 and the geometric entity 735 based on a wedge product of the two spheres. The obstacle detection module 240 may compare the square of the wedge product with a limit bound of the geometric entity 730 or 735. The limit bound may be denoted as $$r_{MAX}^4 - 0.25 r_{MAX}^4,$$

where $$r_{MAX}^4$$

is the radius of the geometric entity 730 or 735. In embodiments where the square of the wedge product is greater than the limit bound, the obstacle detection module 240 can determine that the two geometric entities 730 and 735 do not intersect and that there is no collision between the two objects.

In the embodiments of FIG. 7, the square of the wedge product is equal to or lower than the limit bound, indicating that the two geometric entities 730 and 735 intersect. Next, the obstacle detection module 240 determines whether any geometric entity in the second level of the occupancy representation 700 interests with any geometric entity in the second level of the occupancy representation 705, e.g., by using the method of determining that the two geometric entities 730 and 735 intersect. The obstacle detection module 240 determines that the geometric entities 720A and 720C both intersect with the geometric entity 725. In embodiments where none of the geometric entities 720A-820B intersects with the geometric entity 725, the obstacle detection module 240 determines that there is no collision between the two objects.

As the geometric entities 720A and 720C both intersect with the geometric entity 725, the obstacle detection module 240 will further determine whether any geometric entity in the first level of the occupancy representation 700 interests with any geometric entity in the first level of the occupancy representation 705, e.g., by using the method of determining that the two geometric entities 730 and 735 intersect. Particularly, the obstacle detection module 240 will further determine whether any geometric entity in the first level of the occupancy representation 700 interests with any of the geometric entities 710A, 710B, and 710E-810G (i.e., the geometric entities contained by the geometric entities 720A and 720C) intersects with any of the geometric entities 715A and 715B (i.e., the geometric entities contained by the geometric entity 725). In the embodiments of FIG. 7, the obstacle detection module 240 determines that the geometric entity 710F intersects with the geometric entity 715A. As the lowest hierarchy level is reached, the obstacle detection module 240 determines that the two objects collide. In other embodiments where none of the geometric entities 710A-810G, intersects with any of the geometric entities 715A-815C, the obstacle detection module 240 determines that there is no collision between the two objects.

Figure 8:
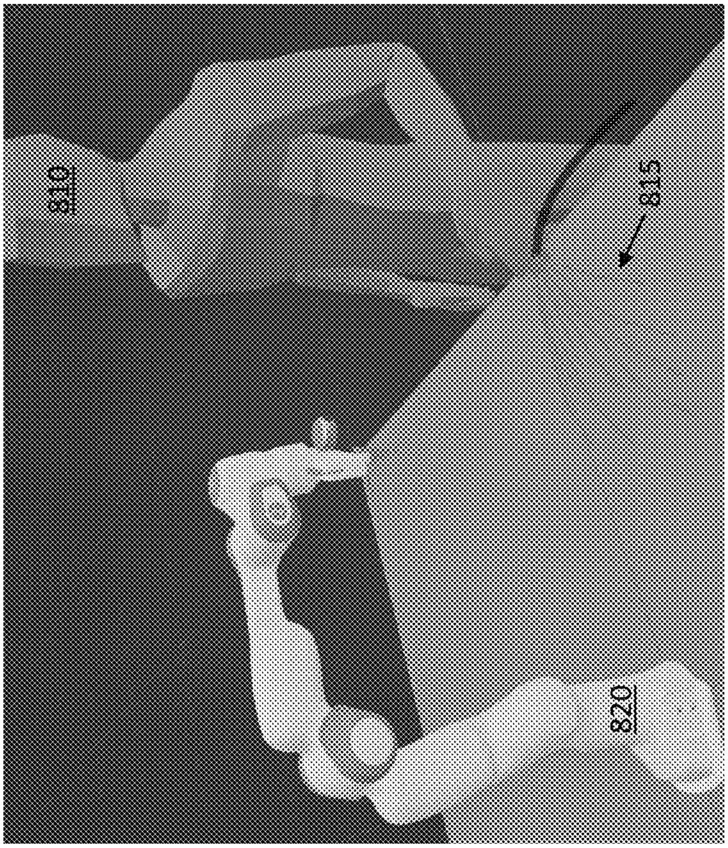
FIG. 8 illustrates an example human-robot collaboration environment, in accordance with various embodiments.

FIG. 8 illustrates an example human-robot collaboration environment 800, in accordance with various embodiments. The human-robot collaboration environment 800 includes a person 810 and a robot 820 that work together, e.g., for the purpose of completing a task. In other embodiments, the human-robot collaboration environment 800 may include multiple persons, multiple robots, or different types of robots. In such a human-robot collaboration environment, timely collision detection can be very important. In some embodiments, robots need to monitor and predict human movements at high framerates to collaborate effectively and avoid conflict. The collision detection method described in conjunction with FIG. 7 may be used to speed up collision detection of dynamic rigid-bodies in the human-robot collaboration environment 800.

In some embodiments, one or more occupancy representations of the body of the person 810 (such as occupancy representations of arms, hands, fingers, head, etc.) can be generated, e.g., by the occupancy representation generator 300 in FIG. 3. An occupancy representation of the person 810 may be computed offline. Also, one or more occupancy representations of the robot 820 may be generated, e.g., by the occupancy representation generator 300 in FIG. 3. In some embodiments, an occupancy representation of the robot 820 can be computed offline, e.g., based on a CAD (Computer Aided Design) model of the robot 820, which can be efficiently transformed for new joint configurations using rotor operation. An example occupancy representation of the person 810 or the robot 820 may be the occupancy representation 140 in FIG. 1 or the occupancy representation 700 or 705 in FIG. 7. In some embodiments, one or more geometric entities in an occupancy representation of the person 810 or the robot 820 may be translated and rotated, e.g., by the rotation module 230 in FIG. 2.

Motion plans of the person 810 or the robot 820 can accelerate detection of collision between the person 810 and the robot 820. FIG. 8 shows an occupancy representation 815 of a hand of the person 810. The occupancy representation 815 includes a plurality of one-dimensional shapes, which are shown as lines in FIG. 8. The lines are along different directions and represent a motion plan of the fingers of the hand of the person 810. For instance, one or more lines in the occupancy representation 815 may indicate a motion route of a finger of the person 810. Efficient human-robot collision checking can facilitate more collision checks in the same time span. This can enable the robot 820 to evaluate a set of possible positions (as opposed to a single position) of the person 810, making feasible the use of probabilistic human intent prediction as part of the planning pipeline.

Example Method of Occupancy Mapping

Figure 9:
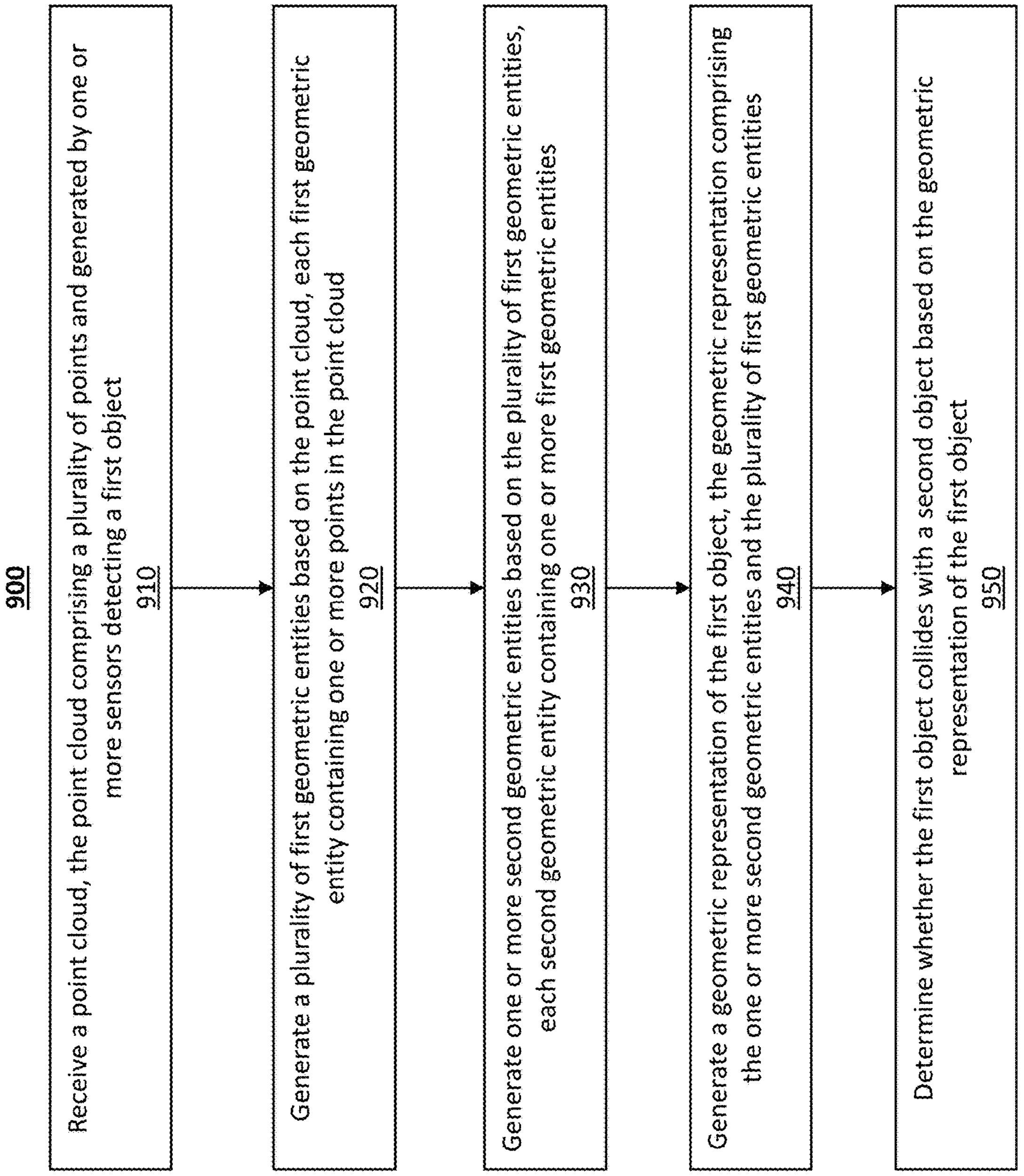
FIG. 9 is a flowchart showing a method of occupancy mapping, in accordance with various embodiments.

FIG. 9 is a flowchart showing a method 900 of occupancy mapping, in accordance with various embodiments. The method 900 may be performed by the occupancy mapping system 130 in FIGS. 1 and 2. Although the method 900 is described with reference to the flowchart illustrated in FIG. 9, many other methods for occupancy mapping may alternatively be used. For example, the order of execution of the steps in FIG. 9 may be changed. As another example, some of the steps may be changed, eliminated, or combined.

The occupancy mapping system 130 receives 910 a point cloud. The point cloud comprising a plurality of points. The point cloud is generated by one or more sensors detecting a first object.

The occupancy mapping system 130 generates 920 a plurality of first geometric entities based on the point cloud. Each first geometric entity contains one or more points in the point cloud, i.e., each of the one or more points are either inside the first geometric entity or lies on a perimeter of the first geometric entity. In some embodiments, the occupancy mapping system 130 generates a first geometric entity based on a wedge product of geometric representations of two or more points in the point cloud. In some embodiments, the occupancy mapping system 130 identifies a point in the point cloud and generates a sphere by using the point as a center of the sphere. The sphere is a first geometric entity of the plurality of first geometric entities.

In some embodiments, the occupancy mapping system 130 generates and determines whether a point in the point cloud is contained by the first geometric entity. After determining that the point is not contained by the first geometric entity, the occupancy mapping system 130 generates another first geometric entity based on the point. The occupancy mapping system 130 may determine whether the point is contained by the first geometric entity by determining whether a wedge product of a geometric representation of the point and the first geometric entity has a negative value.

In some embodiments, the occupancy mapping system 130 generates the plurality of first geometric entities by inputting the point cloud into a trained model. The trained model outputs the plurality of first geometric entities. The trained model may select one or more shapes of the plurality of first geometric entities. The one or more shapes of the plurality of first geometric entities may include one or more three-dimensional shapes (e.g., sphere, ellipsoid, cylinder, cone, cube, cuboid, tetrahedron, pyramid, triangular prism, hexagonal prism, etc.), one or more two-dimensional shapes (e.g., circle, oval, triangle, square, rectangular, parallelogram, trapezoid, pentagon, hexagon, octagon, etc.), one or more one-dimensional shapes (e.g., straight line, curved line, crossed lines, etc.), other shapes, or some combination thereof. In addition to the point cloud, the occupancy mapping system 130 may input other information into the trained model, such as information regarding the object, regarding an environment where the object is located, information regarding another object, and so on.

The occupancy mapping system 130 generates 930 one or more second geometric entities based on the plurality of first geometric entities. Each second geometric entity contains one or more first geometric entities, i.e., the one or more first geometric entities are inside the second geometric entity. In some embodiments, the occupancy mapping system 130 generates a second geometric entity based on a wedge product of two or more first geometric entities. In some embodiments, the occupancy mapping system 130 generates a second geometric entity and determines whether a first geometric entity is in the second geometric entity. After determining that the first geometric entity is not in the second geometric entity, the occupancy mapping system 130 generates another second geometric entity based on the first geometric entity.

In some embodiments, the occupancy mapping system 130 may generate one or more additional geometric entities after the one or more second geometric entities are generated. For instance, the occupancy mapping system 130 may generate one or more third geometric entities, each of which may include two or more second geometric entities. The occupancy mapping system 130 may even further generate one or more fourth geometric entities, each of which may include two or more third geometric entities. The generation of geometric entities by the occupancy mapping system 130 may continue till the occupancy mapping system 130 generates a geometric entity that includes all the points in the point cloud. The geometric entity may include all the other geometric entities that the occupancy mapping system 130 has generated.

The occupancy mapping system 130 generates 940 an occupancy representation of the first object. The occupancy representation includes the one or more second geometric entities and the plurality of first geometric entities. The occupancy representation may have a tree structure with a hierarchy. For instance, the plurality of first geometric entities may be in the first level of the tree structure, and the one or more second geometric entities may be in the second level of the tree structure. Each second geometric entity may be connected to the first geometric entities that are in the second geometric entity. The second geometric entity may be referred to as parent, and the first geometric entities may be referred to as children. In embodiments where the occupancy mapping system 130 generates one or more additional geometric entities, the tree structure may include additional levels.

The occupancy mapping system 130 determines 950 whether the first object collides with a second object based on the occupancy representation of the first object. In some embodiments, the occupancy mapping system 130 determines whether the first object collides with the second object based on the occupancy representation of the first object and an occupancy representation of the second object. The occupancy representation of the second object comprises a plurality of third geometric entities and one or more fourth geometric entities. Each fourth geometric entity includes two or more third geometric entities. In some embodiments, the occupancy mapping system 130 determines whether any second geometric entity intersects with any fourth geometric entity. In response to determining that a second geometric entity intersects with a fourth geometric entity, occupancy mapping system 130 determines whether a first geometric entity in the second geometric entity intersects with a third geometric entity in the fourth geometric entity.

Example Computing Device

Figure 10:
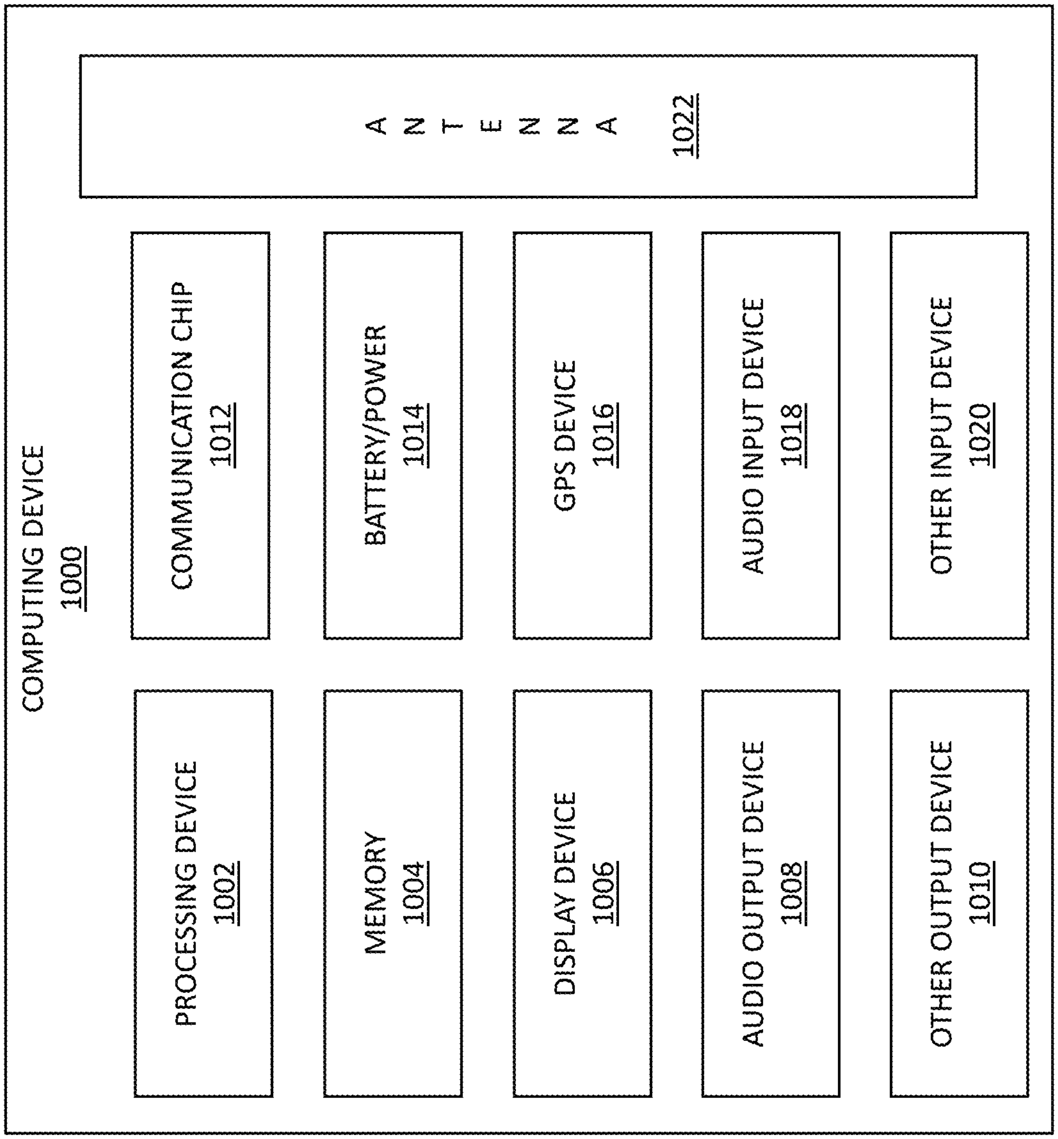
FIG. 10 is a block diagram of an example computing device, in accordance with various embodiments.

FIG. 10 is a block diagram of an example computing device 1000, in accordance with various embodiments. In some embodiments, the computing device 1000 may be used for at least part of the occupancy mapping system 130 in FIGS. 1 and 2. A number of components are illustrated in FIG. 10 as included in the computing device 1000, but any one or more of these components may be omitted or duplicated, as suitable for the application. In some embodiments, some or all of the components included in the computing device 1000 may be attached to one or more motherboards. In some embodiments, some or all of these components are fabricated onto a single system on a chip (SoC) die. Additionally, in various embodiments, the computing device 1000 may not include one or more of the components illustrated in FIG. 10, but the computing device 1000 may include interface circuitry for coupling to the one or more components. For example, the computing device 1000 may not include a display device 1006, but may include display device interface circuitry (e.g., a connector and driver circuitry) to which a display device 1006 may be coupled. In another set of examples, the computing device 1000 may not include an audio input device 1018 or an audio output device 1008, but may include audio input or output device interface circuitry (e.g., connectors and supporting circuitry) to which an audio input device 1018 or audio output device 1008 may be coupled.

The computing device 1000 may include a processing device 1002 (e.g., one or more processing devices). The processing device 1002 processes electronic data from registers and/or memory to transform that electronic data into other electronic data that may be stored in registers and/or memory. The computing device 1000 may include a memory 1004, which may itself include one or more memory devices such as volatile memory (e.g., DRAM), nonvolatile memory (e.g., read-only memory (ROM)), high bandwidth memory (HBM), flash memory, solid state memory, and/or a hard drive. In some embodiments, the memory 1004 may include memory that shares a die with the processing device 1002. In some embodiments, the memory 1004 includes one or more non-transitory computer-readable media storing instructions executable for occupancy mapping or collision detection, e.g., the method 900 described above in conjunction with FIG. 9 or some operations performed by the occupancy mapping system 130 in FIGS. 1 and 2. The instructions stored in the one or more non-transitory computer-readable media may be executed by the processing device 1002.

In some embodiments, the computing device 1000 may include a communication chip 1012 (e.g., one or more communication chips). For example, the communication chip 1012 may be configured for managing wireless communications for the transfer of data to and from the computing device 1000. The term "wireless" and its derivatives may be used to describe circuits, devices, systems, methods, techniques, communications channels, etc., that may communicate data using modulated electromagnetic radiation through a nonsolid medium. The term does not imply that the associated devices do not contain any wires, although in some embodiments they might not.

The communication chip 1012 may implement any of a number of wireless standards or protocols, including but not limited to Institute for Electrical and Electronic Engineers (IEEE) standards including Wi-Fi (IEEE 802.10 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for worldwide interoperability for microwave access, which is a certification mark for products that pass conformity and interoperability tests for the IEEE 802.16 standards. The communication chip 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1012 may operate in accordance with code-division multiple access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1012 may operate in accordance with other wireless protocols in other embodiments. The computing device 1000 may include an antenna 1022 to facilitate wireless communications and/or to receive other wireless communications (such as AM or FM radio transmissions).

In some embodiments, the communication chip 1012 may manage wired communications, such as electrical, optical, or any other suitable communication protocols (e.g., the Ethernet). As noted above, the communication chip 1012 may include multiple communication chips. For instance, a first communication chip 1012 may be dedicated to shorter-range wireless communications such as Wi-Fi or Bluetooth, and a second communication chip 1012 may be dedicated to longer-range wireless communications such as global positioning system (GPS), EDGE, GPRS, CDMA, WiMAX, LTE, EV-DO, or others. In some embodiments, a first communication chip 1012 may be dedicated to wireless communications, and a second communication chip 1012 may be dedicated to wired communications.

The computing device 1000 may include battery/power circuitry 1014. The battery/power circuitry 1014 may include one or more energy storage devices (e.g., batteries or capacitors) and/or circuitry for coupling components of the computing device 1000 to an energy source separate from the computing device 1000 (e.g., AC line power).

The computing device 1000 may include a display device 1006 (or corresponding interface circuitry, as discussed above). The display device 1006 may include any visual indicators, such as a heads-up display, a computer monitor, a projector, a touchscreen display, a liquid crystal display (LCD), a light-emitting diode display, or a flat panel display, for example.

The computing device 1000 may include an audio output device 1008 (or corresponding interface circuitry, as discussed above). The audio output device 1008 may include any device that generates an audible indicator, such as speakers, headsets, or earbuds, for example.

The computing device 1000 may include an audio input device 1018 (or corresponding interface circuitry, as discussed above). The audio input device 1018 may include any device that generates a signal representative of a sound, such as microphones, microphone arrays, or digital instruments (e.g., instruments having a musical instrument digital interface (MIDI) output).

The computing device 1000 may include a GPS device 1016 (or corresponding interface circuitry, as discussed above). The GPS device 1016 may be in communication with a satellite-based system and may receive a location of the computing device 1000, as known in the art.

The computing device 1000 may include another output device 1010 (or corresponding interface circuitry, as discussed above). Examples of the other output device 1010 may include an audio codec, a video codec, a printer, a wired or wireless transmitter for providing information to other devices, or an additional storage device.

The computing device 1000 may include another input device 1020 (or corresponding interface circuitry, as discussed above). Examples of the other input device 1020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1000 may have any desired form factor, such as a handheld or mobile computer system (e.g., a cell phone, a smart phone, a mobile internet device, a music player, a tablet computer, a laptop computer, a netbook computer, an ultrabook computer, a PDA (personal digital assistant), an ultramobile personal computer, etc.), a desktop computer system, a server or other networked computing component, a printer, a scanner, a monitor, a set-top box, an entertainment control unit, a vehicle control unit, a digital camera, a digital video recorder, or a wearable computer system. In some embodiments, the computing device 1000 may be any other electronic device that processes data.

SELECTED EXAMPLES

The following paragraphs provide various examples of the embodiments disclosed herein.

Example 1 provides a method of detecting collision, including receiving a point cloud, the point cloud including a plurality of points and generated by one or more sensors detecting a first object; generating a plurality of first geometric entities based on the point cloud, each first geometric entity containing one or more points in the point cloud; generating one or more second geometric entities based on the plurality of first geometric entities, each second geometric entity containing one or more first geometric entities; generating an occupancy representation of the first object, the occupancy representation including the one or more second geometric entities and the plurality of first geometric entities; and determining whether the first object collides with a second object based on the occupancy representation of the first object.

Example 2 provides the method of example 1, where generating the plurality of first geometric entities includes generating a first geometric entity based on a wedge product of geometric representations of two or more points in the point cloud.

Example 3 provides the method of example 1 or 2, where generating the plurality of first geometric entities includes identifying a point in the point cloud; and generating a sphere by using the point as a center of the sphere, where the sphere is a first geometric entity of the plurality of first geometric entities.

Example 4 provides the method of any of the preceding examples, where generating the plurality of first geometric entities includes generating a first geometric entity; determining whether a point in the point cloud is contained by the first geometric entity; and after determining that the point is not contained by the first geometric entity, generating another first geometric entity based on the point.

Example 5 provides the method of example 4, where determining whether the point is in the first geometric entity includes determining whether a wedge product of a geometric representation of the point and the first geometric entity has a negative value.

Example 6 provides the method of any of the preceding examples, where generating the plurality of first geometric entities includes inputting the point cloud into a trained model, the trained model outputting the plurality of first geometric entities.

Example 7 provides the method of any of the preceding examples, where generating the one or more second geometric entities includes generating a second geometric entity based on a wedge product of two or more first geometric entities.

Example 8 provides the method of any of the preceding examples, where generating the one or more second geometric entities includes generating a second geometric entity; determining whether a first geometric entity is in the second geometric entity; and after determining that the first geometric entity is not in the second geometric entity, generating another second geometric entity based on the first geometric entity.

Example 9 provides the method of any of the preceding examples, where determining whether the first object collides with the second object includes determining whether the first object collides with the second object based on the occupancy representation of the first object and an occupancy representation of the second object, where the occupancy representation of the second object includes a plurality of third geometric entities and one or more fourth geometric entities, and each fourth geometric entity includes two or more third geometric entities.

Example 10 provides the method of example 9, where determining whether the first object collides with the second object includes determining whether any second geometric entity intersects with any fourth geometric entity; and in response to determining that a second geometric entity intersects with a fourth geometric entity, determining whether a first geometric entity in the second geometric entity intersects with a third geometric entity in the fourth geometric entity.

Example 11 provides one or more non-transitory computer-readable media storing instructions executable to perform operations for detecting collision, the operations including receiving a point cloud, the point cloud including a plurality of points and generated by one or more sensors detecting a first object; generating a plurality of first geometric entities based on the point cloud, each first geometric entity containing one or more points in the point cloud; generating one or more second geometric entities based on the plurality of first geometric entities, each second geometric entity containing one or more first geometric entities; generating an occupancy representation of the first object, the occupancy representation including the one or more second geometric entities and the plurality of first geometric entities; and determining whether the first object collides with a second object based on the occupancy representation of the first object.

Example 12 provides the one or more non-transitory computer-readable media of example 11, where generating the plurality of first geometric entities includes generating a first geometric entity based on a wedge product of geometric representations of two or more points in the point cloud.

Example 13 provides the one or more non-transitory computer-readable media of example 11 or 12, where generating the plurality of first geometric entities includes generating a first geometric entity; determining whether a point in the point cloud is contained by the first geometric entity; and after determining that the point is not contained by the first geometric entity, generating another first geometric entity based on the point.

Example 14 provides the one or more non-transitory computer-readable media of any one of examples 11-13, where determining whether the first object collides with the second object includes determining whether the first object collides with the second object based on the occupancy representation of the first object and an occupancy representation of the second object, where the occupancy representation of the second object includes a plurality of third geometric entities and one or more fourth geometric entities, and each fourth geometric entity includes two or more third geometric entities.

Example 15 provides the one or more non-transitory computer-readable media of example 14, where determining whether the first object collides with the second object includes determining whether any second geometric entity intersects with any fourth geometric entity; and in response to determining that a second geometric entity intersects with a fourth geometric entity, determining whether a first geometric entity in the second geometric entity intersects with a third geometric entity in the fourth geometric entity.

Example 16 provides an apparatus, including a computer processor for executing computer program instructions; and a non-transitory computer-readable memory storing computer program instructions executable by the computer processor to perform operations including receiving a point cloud, the point cloud including a plurality of points and generated by one or more sensors detecting a first object, generating a plurality of first geometric entities based on the point cloud, each first geometric entity containing one or more points in the point cloud, generating one or more second geometric entities based on the plurality of first geometric entities, each second geometric entity containing one or more first geometric entities, generating an occupancy representation of the first object, the occupancy representation including the one or more second geometric entities and the plurality of first geometric entities, and determining whether the first object collides with a second object based on the occupancy representation of the first object.

Example 17 provides the apparatus of example 16, where generating the plurality of first geometric entities includes generating a first geometric entity based on a wedge product of geometric representations of two or more points in the point cloud.

Example 18 provides the apparatus of example 16 or 17, where generating the plurality of first geometric entities includes generating a first geometric entity; determining whether a point in the point cloud is contained by the first geometric entity; and after determining that the point is not contained by the first geometric entity, generating another first geometric entity based on the point.

Example 19 provides the apparatus of any one of examples 16-18, where determining whether the first object collides with the second object includes determining whether the first object collides with the second object based on the occupancy representation of the first object and an occupancy representation of the second object, where the occupancy representation of the second object includes a plurality of third geometric entities and one or more fourth geometric entities, and each fourth geometric entity includes two or more third geometric entities.

Example 20 provides the apparatus of example 16, where determining whether the first object collides with the second object includes determining whether any second geometric entity intersects with any fourth geometric entity; and in response to determining that a second geometric entity intersects with a fourth geometric entity, determining whether a first geometric entity in the second geometric entity intersects with a third geometric entity in the fourth geometric entity.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A computer-implemented method, comprising:

receiving a point cloud, the point cloud comprising a plurality of points and generated by one or more sensors detecting a first object;

generating a plurality of first geometric entities based on the point cloud, each first geometric entity containing one or more points in the point cloud;

generating one or more second geometric entities based on the plurality of first geometric entities, each second geometric entity containing one or more first geometric entities;

generating an occupancy representation of the first object, the occupancy representation comprising the one or more second geometric entities and the plurality of first geometric entities; and determining whether the first object collides with a second object based on the occupancy representation of the first object and an occupancy representation of the second object, the occupancy representation of the second object comprising a plurality of third geometric entities and one or more fourth geometric entities, each fourth geometric entity including two or more third geometric entities, wherein determining whether the first object collides with the second object comprises:

determining whether any second geometric entity intersects with any fourth geometric entity, and in response to determining that a second geometric entity intersects with a fourth geometric entity, determining whether a first geometric entity in the second geometric entity intersects with a third geometric entity in the fourth geometric entity.

2. The computer-implemented method of claim 1, wherein generating the plurality of first geometric entities comprises:

generating a first geometric entity based on a wedge product of geometric representations of two or more points in the point cloud.

3. The computer-implemented method of claim 1, wherein generating the plurality of first geometric entities comprises:

identifying a point in the point cloud; and generating a sphere by using the point as a center of the sphere, wherein the sphere is a first geometric entity of the plurality of first geometric entities.

4. The computer-implemented method of claim 1, wherein generating the plurality of first geometric entities comprises:

generating a first geometric entity;

determining whether a point in the point cloud is contained by the first geometric entity; and after determining that the point is not contained by the first geometric entity, generating another first geometric entity based on the point.

5. The computer-implemented method of claim 4, wherein determining whether the point is in the first geometric entity comprises:

determining whether a wedge product of a geometric representation of the point and the first geometric entity has a negative value.

6. The computer-implemented method of claim 1, wherein generating the plurality of first geometric entities comprises:

inputting the point cloud into a trained model, the trained model outputting the plurality of first geometric entities.

7. The computer-implemented method of claim 1, wherein generating the one or more second geometric entities comprises:

generating a second geometric entity based on a wedge product of two or more first geometric entities.

8. The computer-implemented method of claim 1, wherein generating the one or more second geometric entities comprises:

generating a second geometric entity;

determining whether a first geometric entity is in the second geometric entity; and after determining that the first geometric entity is not in the second geometric entity, generating another second geometric entity based on the first geometric entity.

9. One or more non-transitory computer-readable media storing instructions executable to perform operations, the operations comprising:

receiving a point cloud, the point cloud comprising a plurality of points and generated by one or more sensors detecting a first object;

generating a plurality of first geometric entities based on the point cloud, each first geometric entity containing one or more points in the point cloud;

generating one or more second geometric entities based on the plurality of first geometric entities, each second geometric entity containing one or more first geometric entities;

generating an occupancy representation of the first object, the occupancy representation comprising the one or more second geometric entities and the plurality of first geometric entities; and determining whether the first object collides with a second object based on the occupancy representation of the first object and an occupancy representation of the second object, the occupancy representation of the second object comprising a plurality of third geometric entities and one or more fourth geometric entities, each fourth geometric entity including two or more third geometric entities, wherein determining whether the first object collides with the second object comprises:

determining whether any second geometric entity intersects with any fourth geometric entity, and in response to determining that a second geometric entity intersects with a fourth geometric entity, determining whether a first geometric entity in the second geometric entity intersects with a third geometric entity in the fourth geometric entity.

10. The one or more non-transitory computer-readable media of claim 9, wherein generating the plurality of first geometric entities comprises:

generating a first geometric entity based on a wedge product of geometric representations of two or more points in the point cloud.

11. The one or more non-transitory computer-readable media of claim 9, wherein generating the plurality of first geometric entities comprises:

generating a first geometric entity;

determining whether a point in the point cloud is contained by the first geometric entity; and after determining that the point is not contained by the first geometric entity, generating another first geometric entity based on the point.

12. An apparatus, comprising:

a computer processor for executing computer program instructions; and a non-transitory computer-readable memory storing computer program instructions executable by the computer processor to perform operations comprising:

receiving a point cloud, the point cloud comprising a plurality of points and generated by one or more sensors detecting a first object, generating a plurality of first geometric entities based on the point cloud, each first geometric entity containing one or more points in the point cloud, generating one or more second geometric entities based on the plurality of first geometric entities, each second geometric entity containing one or more first geometric entities, generating an occupancy representation of the first object, the occupancy representation comprising the one or more second geometric entities and the plurality of first geometric entities, and determining whether the first object collides with a second object based on the occupancy representation of the first object and an occupancy representation of the second object, the occupancy representation of the second object comprising a plurality of third geometric entities and one or more fourth geometric entities, each fourth geometric entity including two or more third geometric entities, wherein determining whether the first object collides with the second object comprises:

determining whether any second geometric entity intersects with any fourth geometric entity, and in response to determining that a second geometric entity intersects with a fourth geometric entity, determining whether a first geometric entity in the second geometric entity intersects with a third geometric entity in the fourth geometric entity.

13. The apparatus of claim 12, wherein generating the plurality of first geometric entities comprises:

generating a first geometric entity based on a wedge product of geometric representations of two or more points in the point cloud.

14. The apparatus of claim 12, wherein generating the plurality of first geometric entities comprises:

generating a first geometric entity;

determining whether a point in the point cloud is contained by the first geometric entity; and after determining that the point is not contained by the first geometric entity, generating another first geometric entity based on the point.

* * * * *